United States Patent
Meltzer

(10) Patent No.: US 7,265,635 B2
(45) Date of Patent: Sep. 4, 2007

(54) METHOD AND APPARATUS FOR ASSISTING PULL-IN OF A PHASE-LOCKED LOOP

(75) Inventor: David Meltzer, Wappinger Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 48 days.

(21) Appl. No.: 11/212,233

(22) Filed: Aug. 26, 2005

(65) Prior Publication Data

US 2007/0046382 A1    Mar. 1, 2007

(51) Int. Cl.
*H03L 7/00* (2006.01)

(52) U.S. Cl. .................... 331/16; 331/34; 331/17; 331/177 R; 327/156; 375/376

(58) Field of Classification Search .............. 331/16, 331/17, 34, 177 R; 375/376; 327/156
See application file for complete search history.

(56) References Cited

U.S. PATENT DOCUMENTS

| | | | |
|---|---|---|---|
| 4,320,360 A | 3/1982 | Thomas | |
| 4,375,694 A | 3/1983 | Kuhn | |
| 4,443,769 A | 4/1984 | Aschwanden et al. | |
| 5,124,669 A | 6/1992 | Palmer et al. | |
| 5,394,115 A | 2/1995 | Lampel | |
| 5,619,484 A | 4/1997 | Yokota et al. | |
| 5,818,304 A * | 10/1998 | Hogeboom | 331/11 |
| 6,031,427 A | 2/2000 | Black | |
| 2006/0208809 A1* | 9/2006 | Erdogan | 331/17 |

* cited by examiner

*Primary Examiner*—Arnold Kinkead

(57) ABSTRACT

A method, algorithm, software, architecture, circuit, and/or system for assisting pull-in of a phase-locked loop (PLL) are disclosed. In one embodiment, a PLL can include: (i) a phase detector that may receive a serial data stream and output a pump control signal; (ii) a charge pump that can receive the pump control signal and substantially determine a frequency control when a precharge signal is de-asserted; (iii) a precharge/filter circuit that may connect to the charge pump and may substantially determine the frequency control when the precharge signal is asserted; and (iv) an oscillator that may connect to the precharge/filter circuit and may provide a recovered clock in response to the frequency control, where the recovered clock may be correlated to a frequency of the serial data stream. The frequency control may be current and/or voltage based, for example. Embodiments of the present invention can advantageously provide a reliable and simplified design approach for pulling-in a PLL lock.

16 Claims, 9 Drawing Sheets

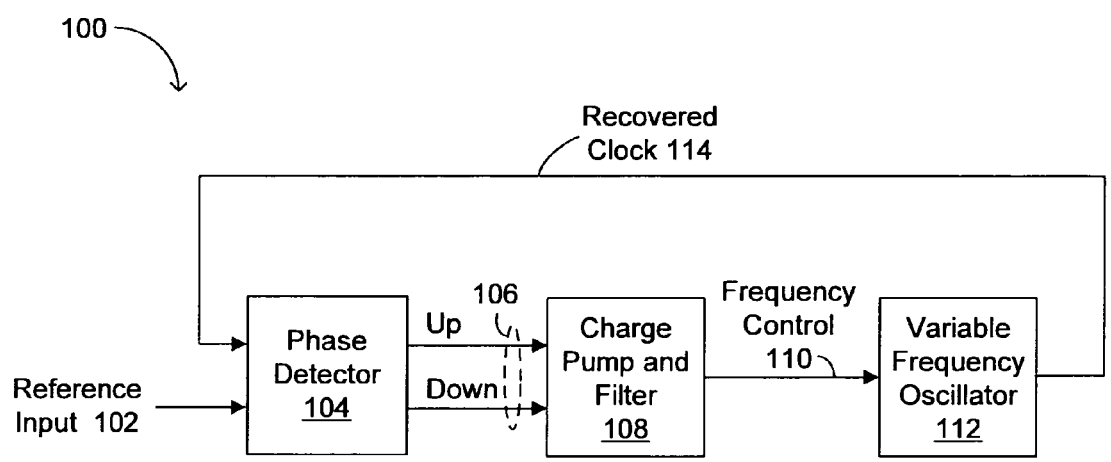
FIG. 1 (conventional)

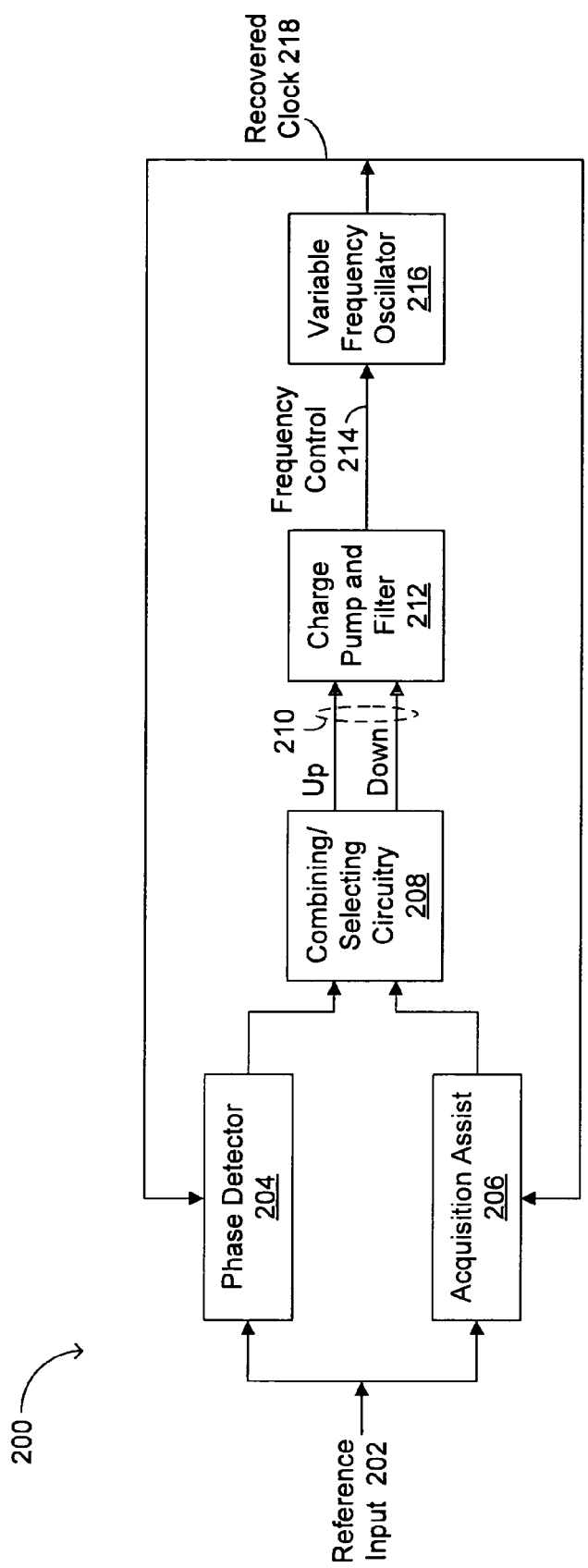
FIG. 2 (conventional)

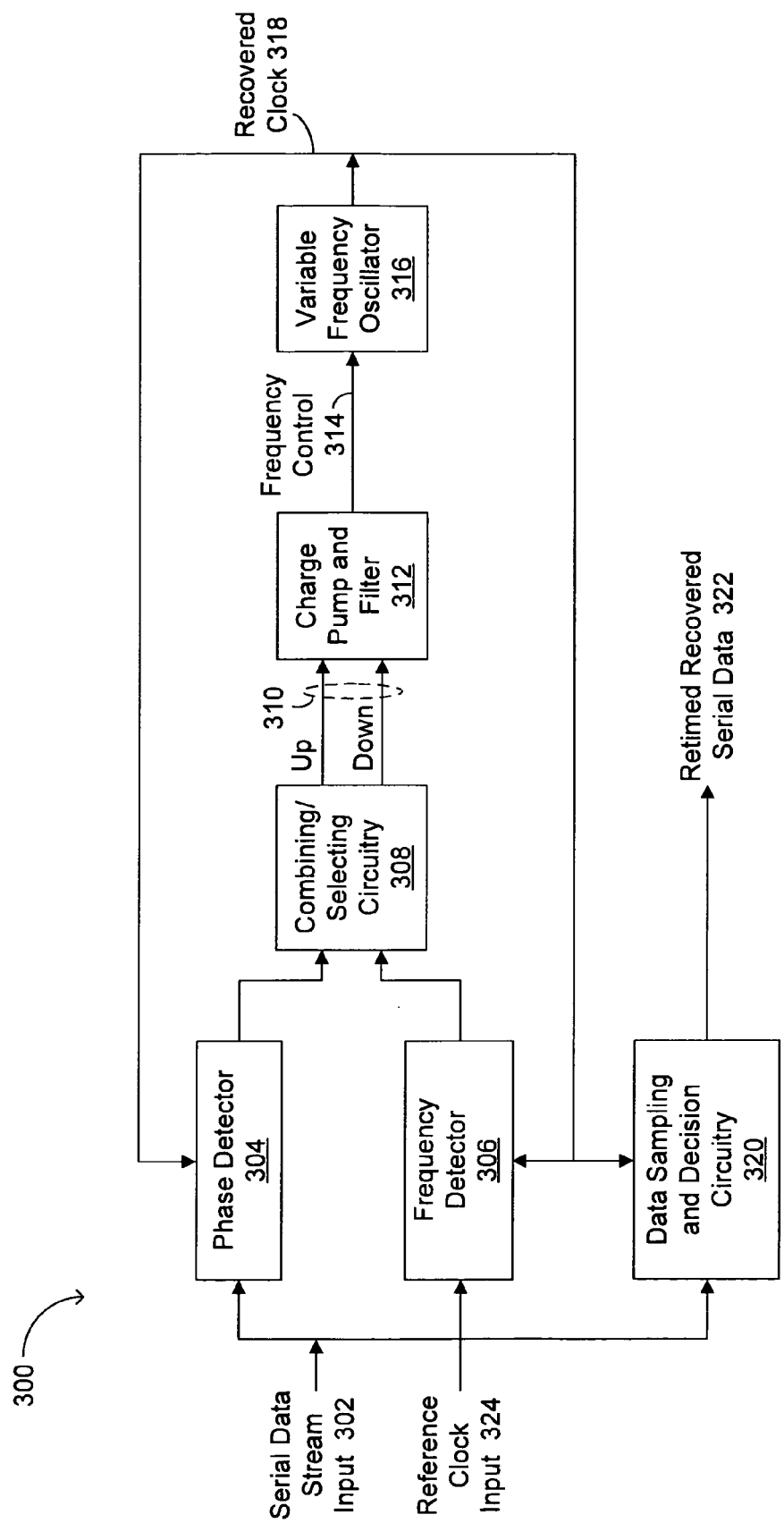
FIG. 3 (conventional)

METHOD AND APPARATUS FOR ASSISTING PULL-IN OF A PHASE-LOCKED LOOP

FIELD OF THE INVENTION

The present invention generally relates to the field of clock circuits. More specifically, embodiments of the present invention pertain to methods, algorithms, software, architectures, circuits, and/or systems for assisting pull-in of a phase-locked loop (PLL).

DISCUSSION OF THE BACKGROUND

In many digital communication systems, phase-locked loop (PLL) circuits are employed in various applications, such as clock synthesis and/or clock or data signal recovery (e.g., from a nonreturn-to-zero (NRZ)-encoded high speed serial data stream). Referring now to FIG. 1, a block schematic diagram shows a conventional PLL circuit 100 using phase detector 104 to compare recovered clock 114 to reference input 102. Phase detector 104 can receive reference input 102 and recovered clock 114 while providing up/down controls 106 to charge pump and filter 108. Variable frequency oscillator (VFO) 112 can receive frequency control 110 from charge pump and filter 108 and may provide recovered clock 114. One drawback of this approach is that the "pull-in range" or the frequency range over which an unlocked PLL may lock to a reference frequency (e.g., reference input 102) is relatively small.

Referring now to FIG. 2, a block schematic diagram shows a conventional PLL circuit 200 having acquisition assist portion 206. Phase detector 204 and acquisition assist 206 can each receive reference input 202 and recovered clock 218. Combining/selecting circuitry 208 can receive signals from phase detector 204 and acquisition assist 206 and may provide up/down controls 210 to charge pump and filter 212. VFO 216 can receive frequency control 214 from charge pump and filter 212 and may provide recovered clock 218. Acquisition assist 206 may operate to effectively widen the pull-in range of PLL 200, as compared to PLL 100 of FIG. 1, for example. However, a combined phase/frequency detector is more desirable for circuit area and overall circuit simplicity than using additional auxiliary circuitry (e.g., acquisition assist 206). But, for PLL applications, such as embedded clock recovery from a serial bit stream (as opposed to the clock synthesizer application shown in FIG. 2), a dedicated or separate phase detector circuit is typically used because there may be essentially no energy at the fundamental data frequency in a high-speed serial data stream (e.g., an NRZ-encoded data stream). A combined phase/frequency detector consistent with such conventional approaches may undesirably lock to an incorrect frequency value.

FIG. 3 shows a block schematic diagram of conventional PLL circuit 300 receiving serial data stream input 302. Phase detector 304 and data sampling and decision circuitry 320 can each receive serial data stream input 302 and recovered clock 318. Data sampling and decision circuitry 320 can provide retimed recovered serial data 322. Frequency detector 306 can receive reference clock input 324 and recovered clock 318. Combining/selecting circuitry 308 can receive signals from phase detector 304 and frequency detector 306 and may provide up/down controls 310 to charge pump and filter 312. VFO 316 can receive frequency control 314 from charge pump and filter 312 and may provide recovered clock 318. In this approach, reference clock input 324 may be generated locally to the PLL and may be used with frequency detector 306 to initially pull-in the PLL. Once PLL lock to reference clock input 324 is achieved, control of the loop frequency may be passed to phase detector 304 (e.g., an Alexander or Hogge style phase detector) which can track transitions in serial data stream input 302. However, a drawback of this approach is increased system cost and complexity due to maintaining a reference clock approximately at the fundamental data frequency of serial data stream input 302.

What is needed is a reliable and simplified pull-in assist mechanism, which does not require a reference clock or an auxiliary frequency detector.

SUMMARY OF THE INVENTION

Embodiments of the present invention relate to methods, algorithms, software, architectures, circuits, and/or systems for assisting pull-in of a phase-locked loop (PLL).

In one embodiment, a PLL can include: (i) a phase detector that may receive a serial data stream and output a pump control signal; (ii) a charge pump that can receive the pump control signal and substantially determine a frequency control when a precharge signal is de-asserted; (iii) a precharge/filter circuit that may connect to the charge pump and may substantially determine the frequency control when the precharge signal is asserted; and (iv) an oscillator that may connect to the precharge/filter circuit and may provide a recovered clock in response to the frequency control, where the recovered clock may be correlated to a frequency of the serial data stream. The frequency control may be current and/or voltage based, for example. The oscillator may be a variable frequency voltage controlled oscillator, for example.

In another embodiment, a method of controlling an oscillator can include the steps of: (i) asserting a precharge control signal for setting a frequency control to substantially minimize a frequency of the oscillator; (ii) enabling a phase detector control of the frequency control by de-asserting the precharge control signal; and (iii) locking a PLL correlating to a frequency of a received serial data stream in response to the frequency control. A leakage on the frequency control can also be used during the step of enabling, for example.

In another embodiment, a precharge/filter circuit can include: (i) a first transistor that can connect to a frequency control, where the first transistor is controllable by a precharge control signal; (ii) a resistor that can connect between the frequency control and a node; (iii) a second transistor that can connect to the node, where the second transistor is also controllable by the precharge control signal; and (iv) a first capacitor that can connect to the node and a supply. The precharge/filter circuit can further include a second capacitor that can connect to the frequency control and the supply.

Embodiments of the present invention can advantageously provide a reliable and simplified design approach for pulling-in a PLL lock. Further, embodiments of the present invention can advantageously provide a pull-in assist mechanism, which does not require a reference clock or an auxiliary frequency detector. These and other advantages of the present invention will become readily apparent from the detailed description of preferred embodiments below.

BRIEF DESCRIPTION OF THE DRAWINGS

FIG. 1 is a block schematic diagram showing a conventional phase-locked loop (PLL) circuit using a phase detector to compare a recovered clock to a reference input.

FIG. 2 is a block schematic diagram showing a conventional PLL circuit having an acquisition assist portion.

FIG. 3 is a block schematic diagram showing a conventional PLL circuit receiving a serial data stream input.

DETAILED DESCRIPTION OF THE PREFERRED EMBODIMENTS

Figure 4A:
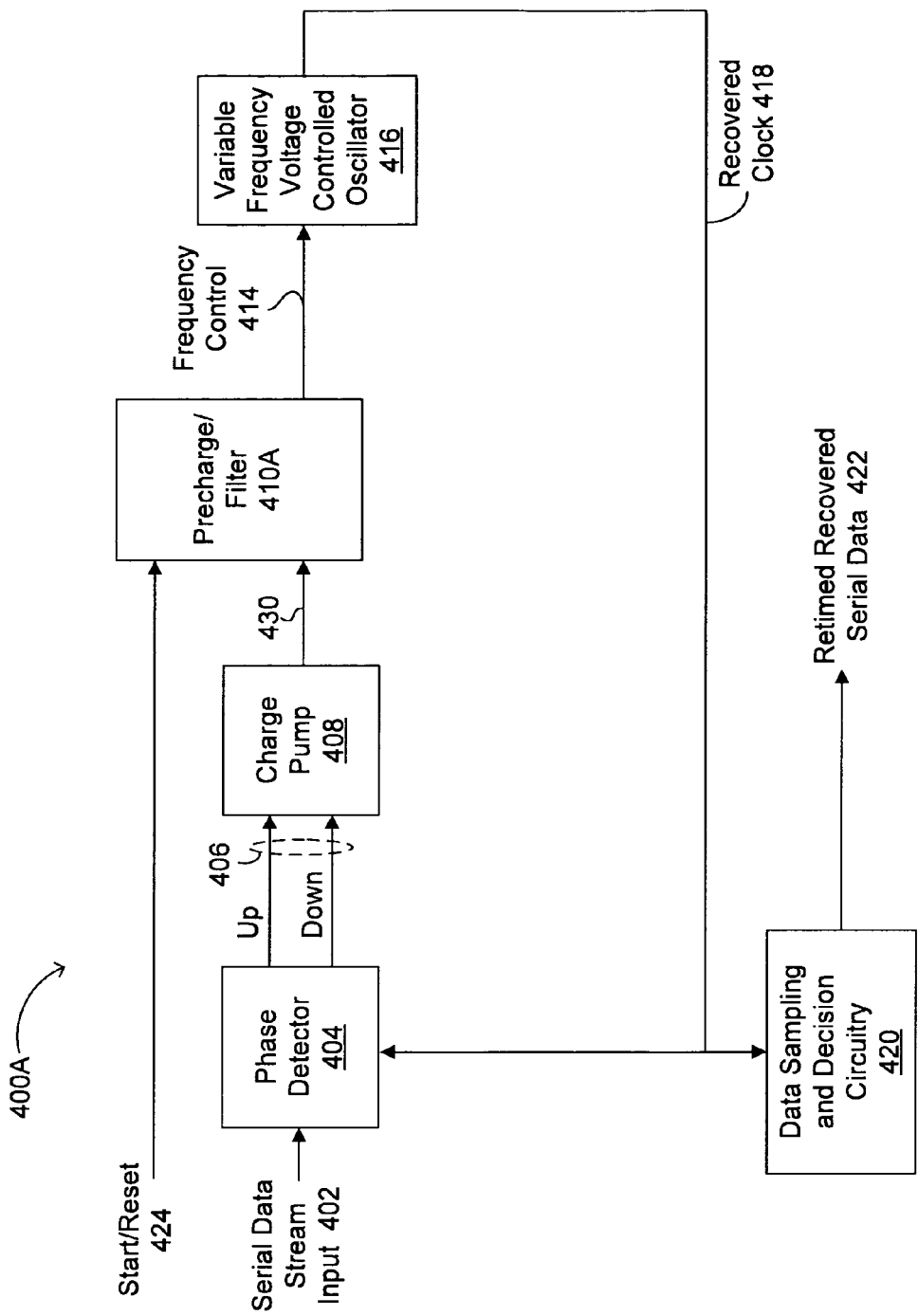
FIG. 4A is an exemplary schematic diagram showing a PLL circuit in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," and (b) the terms "connected to," "coupled with," "coupled to," and "in communication with," (which may refer to direct or indirect connections, couplings, or communications) but these terms are generally given their art-recognized meanings herein.

Embodiments of the present invention relate to methods, algorithms, software, architectures, circuits, and/or systems for assisting pull-in of a phase-locked loop (PLL). For example, a PLL can include: (i) a phase detector that may receive a serial data stream and output a pump control signal; (ii) a charge pump that can receive the pump control signal and substantially determine a frequency control when a precharge signal is de-asserted; (iii) a precharge/filter circuit that may connect to the charge pump and may substantially determine the frequency control when the precharge signal is asserted; and (iv) an oscillator that may connect to the precharge/filter circuit and may provide a recovered clock in response to the frequency control, where the recovered clock may be correlated to a frequency of the serial data stream. The frequency control may be current and/or voltage based, for example. The oscillator may be a variable frequency voltage controlled oscillator, for example.

In another aspect of the invention, a precharge/filter circuit can include: (i) a first transistor that can connect to a frequency control, where the first transistor is controllable by a precharge control signal; (ii) a resistor that can connect between the frequency control and a node; (iii) a second transistor that can connect to the node, where the second transistor may also be controlled by the precharge control signal; and (iv) a first capacitor that can connect to the node and a supply. The precharge/filter circuit can further include a second capacitor that can connect to the frequency control and the supply.

In another aspect of the invention, a method and/or algorithm of controlling an oscillator can include the steps of: (i) asserting a precharge control signal for setting a frequency control to substantially minimize a frequency of the oscillator; (ii) enabling a phase detector control of the frequency control by de-asserting the precharge control signal; and (iii) locking a PLL correlating to a frequency of a received serial data stream in response to the frequency control. A leakage on the frequency control can also be used during the step of enabling, for example.

In a further aspect of the invention, software relates to a medium or waveform containing a computer-readable set of instructions, where the instructions can be adapted to perform a method, such as a method of controlling an oscillator, including: (i) asserting a precharge control signal for setting a frequency control to substantially minimize a frequency of the oscillator; (ii) enabling a phase detector control of the frequency control by de-asserting the precharge control signal; and (iii) locking a PLL correlating to a frequency of a received serial data stream in response to the frequency control.

The invention further relates to hardware and/or software implementations of the present architecture, method and system. Embodiments of the present invention can advantageously provide a reliable and simplified design approach for pulling-in a PLL lock. Further, embodiments of the present invention can advantageously provide a lock-in assist mechanism which does not require a reference clock or an auxiliary frequency detector. The invention, in its various aspects, will be explained in greater detail below with regard to exemplary embodiments.

Embodiments of the present invention may relate to variable frequency oscillator (VFO) frequency range applications that encompass a fundamental data frequency of a received serial data stream where a phase detector controlled loop may generally lock to an incoming serial data stream frequency when the VFO frequency is sufficiently close to the fundamental data frequency. For example, systems have been measured which may require such a VFO frequency to be within about 3% of a center or fundamental data frequency before lock can be achieved. Accordingly, where an incoming data stream is present with sufficient transition density, an approach (in accordance with certain embodiments of the invention) that moves the VFO frequency over substantially its entire range is essentially guaranteed to come within the pull-in range. Further, an approach in accordance with further embodiments of the invention may move the VFO frequency over its range relatively slowly to allow an associated phase detector sufficient time to pull-in the loop. Accordingly, in some particular applications, the pull-in time may be longer than with a separate active pull-in assist approach. In one aspect of embodiments, such a frequency moving mechanism may also be sufficiently weak so that the phase detector can gain control when necessary (i.e., when the VFO frequency is within the pull-in range) to obtain lock.

A typical loop filter configured for use in accordance with various embodiments can include one or more capacitors to establish filter poles. These filter capacitors can be charged to a voltage and then any relatively slow charging or discharging mechanism may then change the filter output. An output of such a filter may be the frequency control voltage, so the frequency control voltage may change over a wide frequency range after an initial precharge.

In order to allow the frequency control voltage to change over time, two natural mechanisms that exist in conventional CMOS charge pump and voltage controlled oscillator (VCO) and/or VFO designs can be used. The first mechanism is leakage currents in the charge pump drive and the frequency control voltage input to the VCO. The second mechanism is conventional normal operation slewing of phase as related to a frequency difference between the reference data stream (e.g., received serial data) and the local oscillator (e.g., a VCO and/or VFO), which can cause a change in the frequency control voltage. Factors that determine an ideal precharge voltage for a frequency control voltage may include the slope of the frequency control voltage versus the VCO frequency curve, as well as the types of leakage mechanisms present in the circuit.

An Exemplary Phase-Locked Loop (PLL) Circuit

An exemplary PLL circuit can include: (i) a phase detector that may receive a serial data stream and output a pump control signal; (ii) a charge pump that can receive the pump control signal and substantially determine a frequency control when a precharge signal is de-asserted; (iii) a precharge/filter circuit that may connect to the charge pump and may substantially determine the frequency control when the precharge signal is asserted; and (iv) an oscillator that may connect to the precharge/filter circuit and may provide a recovered clock in response to the frequency control, where the recovered clock may be correlated to a frequency of the serial data stream. The frequency control may be current and/or voltage based, for example. The oscillator may be a variable frequency voltage controlled oscillator, for example.

Referring now to FIG. 4A, an exemplary schematic diagram showing a PLL circuit in accordance with certain embodiments of the present invention is indicated by the general reference character 400A. Serial data stream input 402 can be received by phase detector 404. Up/down control signals 406 can be generated by phase detector 404 and may be provided to charge pump 408. Frequency control 414 can couple charge pump 408 to variable frequency voltage controlled oscillator (VCO) 416. Frequency control 414 can also be coupled to precharge/filter circuitry 410A. Variable frequency VCO 416 can provide recovered clock 418. Recovered clock 418 can connect to phase detector 404 and data sampling and decision circuitry 420. Further, data sampling and decision circuitry 420 can generate retimed recovered serial data 422.

In the example configuration of FIG. 4A, precharge/filter 410A can receive start/reset signal 424 as well as signal 430 from charge pump 408. Precharge/filter 410A can output frequency control signal 414, as will be discussed in more detail below.

Figure 4B:
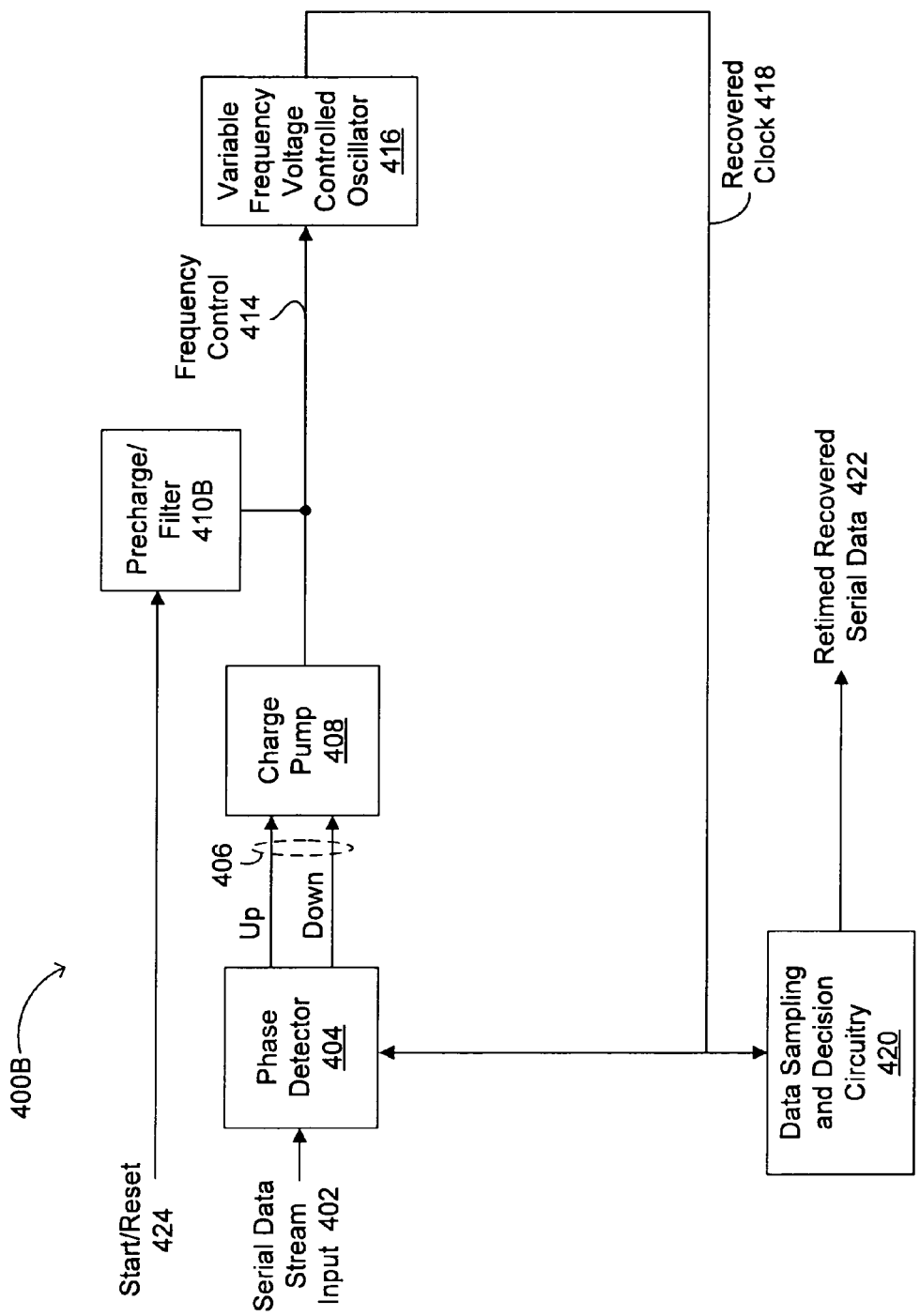
FIG. 4B is an exemplary schematic diagram showing a PLL circuit in accordance with alternate embodiments of the present invention.

FIG. 4B shows an alternate configuration in accordance with other embodiments of the present invention, indicated by the general reference character 400B. In this configuration, precharge/filter 410B can receive start/reset signal 424 and can output a component of frequency control signal 414. As shown in FIG. 4B, charge pump 408 can also directly output a component of frequency control signal 414. Accordingly, depending on operational conditions, precharge/filter 410B and charge pump 408 may each provide substantially direct control of frequency control 414 in this particular example (see, e.g., the discussion of the operation of the present circuit below).

Figure 4C:
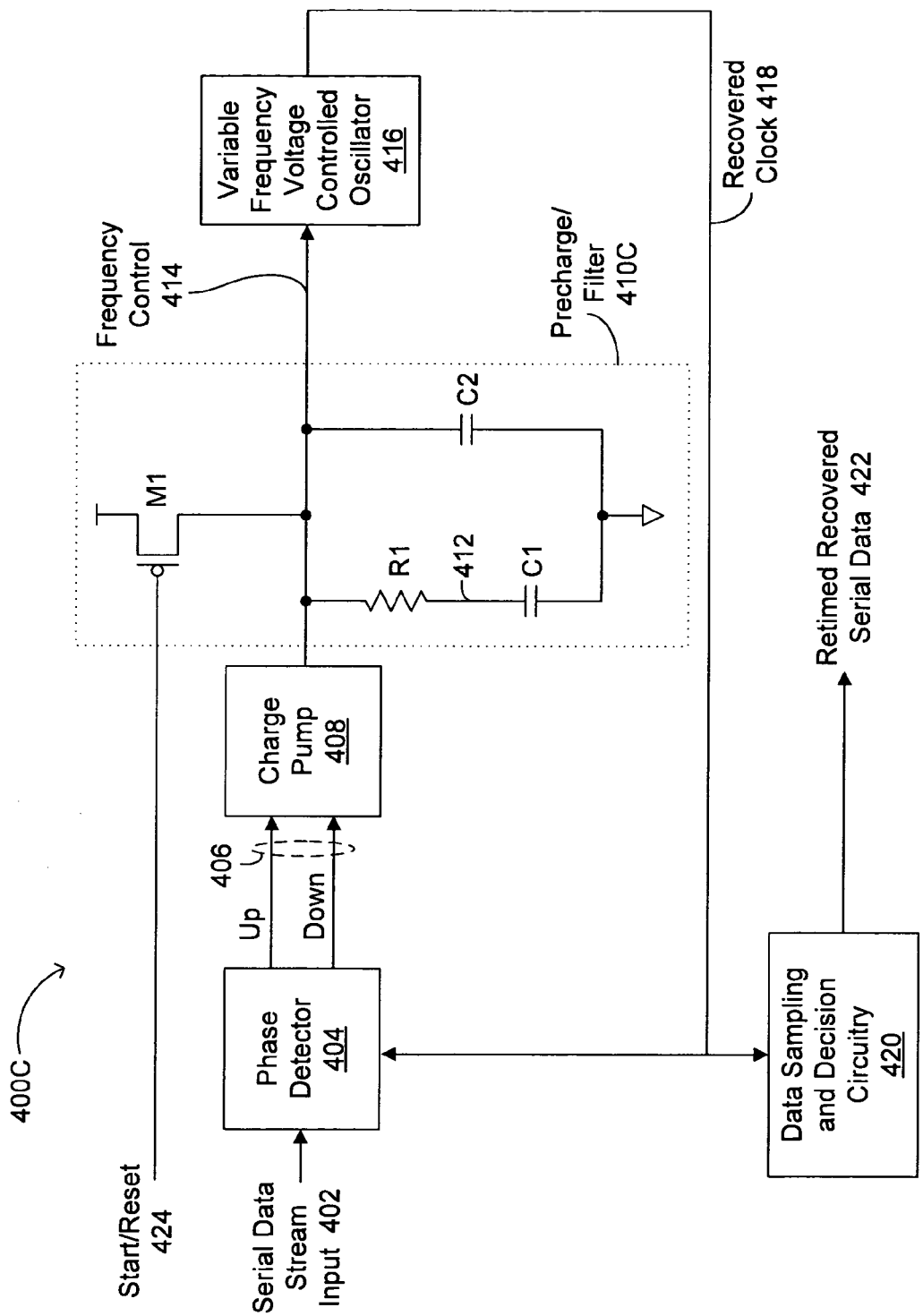
FIG. 4C is an exemplary schematic diagram showing a PLL circuit with a detailed precharge/filter schematic in accordance with embodiments of the present invention.

FIG. 4C shows an exemplary schematic diagram of PLL circuit 400C with a detailed precharge/filter schematic in accordance with further embodiments of the present invention. In this particular example, precharge/filter 410C can include transistor (e.g., a PMOS transistor) M1 having a gate coupled to start/reset signal 424. The source of M1 can connect to a power supply (e.g., Vdd) and the drain of M1 can connect to frequency control 414. Capacitor C1 can connect to ground (e.g., Vss) and to node 412. Resistor R1 can connect to node 412 and to frequency control 414. Capacitor C2 can connect to ground and to frequency control 414. Capacitor C1 and/or capacitor C2 can be a variable capacitor or varactor whereby the associated capacitance value may be changed (e.g., in response to a voltage or other control).

Figure 5:
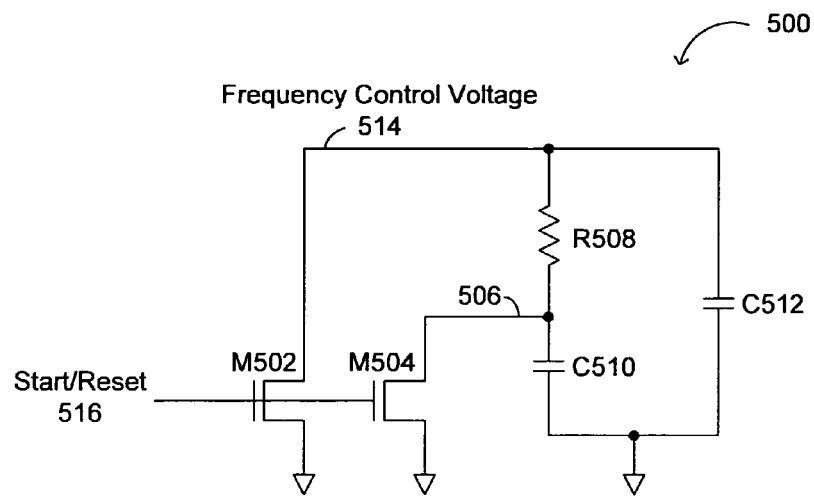
FIG. 5 is an exemplary schematic diagram showing an alternate embodiment of a precharge/filter circuit in accordance with embodiments of the present invention.

In operation, when a serial data stream is first present, such as where the serial data stream transitions after a period of no transitions (e.g., at serial data stream input 402), start/reset signal 424 may be asserted (e.g., made negative or "low" with respect to Vdd, or alternatively, made positive or "high" with respect to ground in the circuit of FIG. 5). Referring back to FIG. 4C, when start/reset signal 424 is low, transistor M1 may be turned "on" and the filter portion of precharge/filter 410C (e.g., via frequency control 414) can be charged to Vdd. According to various embodiments, start/reset signal 424 may be asserted for a time sufficient for VCO 416 to substantially respond to the control voltage (e.g., frequency control 414). Then, start/reset 424 may be returned to a "high" voltage (e.g., equal to Vdd so that M1 is "off"). Assuming a negative slope VCO, the output of variable frequency VCO 416 (e.g., recovered clock 418) may be at a minimum frequency when start/reset signal 424 transitions and becomes de-asserted (e.g., changes from a "high" to a "low" state). Leakage and phase slewing, as discussed above, may gradually lower frequency control 414 until the frequency of recovered clock 418 is sufficiently close to the fundamental data frequency (e.g., at serial data stream input 402) for phase detector 404 to lock the loop. Since no new energy is put into the filter portion of precharge/filter 410C by transistor M1 (because start/reset signal 424 is high), phase detector 404 may be substantially in control of the loop at this point.

As discussed above, sufficient leakage mechanisms should be present in the circuit to allow the frequency control voltage to change from the precharged level (e.g., Vdd) to allow for an effective frequency range sweep. Accordingly, design considerations must include the characterization of associated leakage mechanisms. Further, if the natural leakage mechanisms are insufficient (e.g., not enough leakage is present), such leakage devices (e.g., resistors coupled to ground) can be added specifically for this purpose. If such leakage is too low, the frequency control voltage may take too long to change from its precharged state and the overall PLL lock time may be increased. Conversely, if the leakage is too high, the frequency control voltage range will be swept too quickly and the phase detector may not be able to override the leakage to maintain the PLL lock. Accordingly, a suitable leakage rate should be attained. In accordance with certain embodiments of the present invention, controllable and/or selectable leakage devices (e.g., resistors coupled to ground) can be included to tailor the circuit, if necessary, in order to provide suitable leakage on the frequency control voltage.

While the above example includes voltage-based control of an oscillator, one skilled in the art will recognize that current-based control may also be used in accordance with other various embodiments of the invention. Further, while the examples of FIGS. 4A, 4B, and 4C show single-ended data (e.g., serial data stream input 402) and control, one skilled in the art will recognize that differential signaling and/or control may also be used in accordance with various embodiments.

An Exemplary Precharge/Filter Circuit

An exemplary precharge/filter circuit can include: (i) a first transistor that can connect to a frequency control, where the first transistor is controllable by a precharge control signal; (ii) a resistor that can connect between the frequency control and a node; (iii) a second transistor that can connect to the node, where the second transistor is also controllable by the precharge control signal; and (iv) a first capacitor that can connect to the node and a supply. The precharge/filter circuit can further include a second capacitor that can connect to the frequency control and the supply.

Referring now to FIG. 5, an exemplary schematic diagram showing an alternate embodiment of a precharge/filter circuit in accordance with certain embodiments of the present invention is indicated by the general reference character 500. Start/reset 516 can connect to the gates of (e.g., NMOS) transistors M502 and M504. The sources of transistors M502 and M504 can connect to ground (e.g., Vss). The drain of transistor M502 can connect to frequency control voltage 514 while the drain of transistor M504 can connect to node 506. Resistor R508 can connect to frequency control voltage 514 and to node 506. Capacitor C510 can connect to node 506 and to Vss while capacitor C512 can connect to frequency control voltage 514 and to Vss.

The alternate embodiment of FIG. 5 may be particularly suitable for positive slope oscillator configurations. In such cases, precharge to ground (as opposed to precharge to Vdd) may be desirable because the low frequency occurs when the control voltage (e.g., frequency control voltage 514) is at or near zero. Start/reset 516 may be asserted (e.g., made "high" or equal to Vdd) so that frequency control voltage 514 may be discharged. Start/reset 516 may be asserted for a time sufficient for an associated VCO to respond to frequency control voltage 514 prior to returning to a low (de-asserted) level. Alternatively, capacitor C512 may not be included in some filter configurations.

Figure 6:
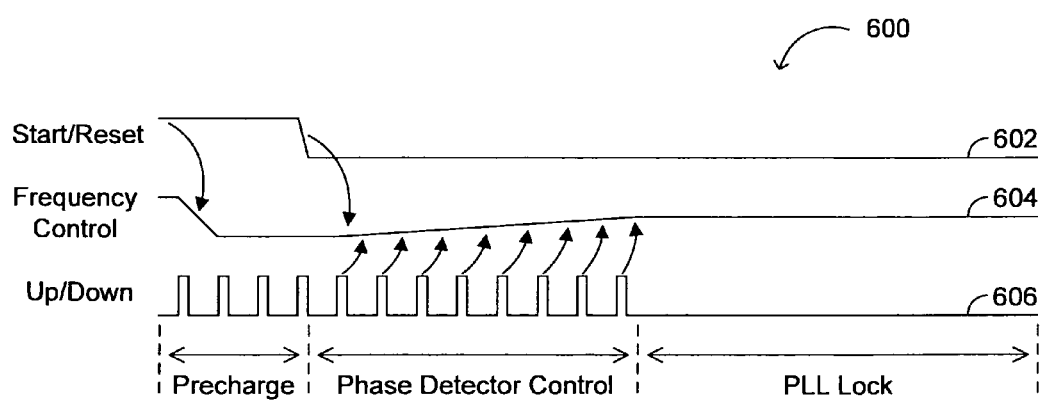
FIG. 6 is an exemplary waveform diagram showing a precharge and a phase detector control operation example in accordance with embodiments of the present invention.

Referring now to FIG. 6, an exemplary waveform diagram showing a precharge and a phase detector control operation example in accordance with certain embodiments of the present invention is indicated by the general reference character 600. In this very particular example of a PLL control circuit operation, the precharge/filter circuit 500 of FIG. 5 can be viewed in place of precharge/filter 410C of FIG. 4C, for example. Accordingly, exemplary waveform diagram 600 is suitable for a positive slope oscillator configuration.

As shown in waveform 602, start/reset (e.g., start/reset signal 516 or 424) can be asserted during a precharge phase and brought low or de-asserted during phase detector control and PLL lock. Of course, phase detector control essentially remains during the PLL lock period, but further up/down adjustments may not need to be made. As shown in waveform 604, frequency control (e.g., frequency control voltage 514 or frequency control 414) can discharge in response to start/reset being asserted and may be allowed to rise in response to phase detector control once start/reset is returned to a low state. As shown in waveform 606, up/down control signals (e.g., up/down 406) can be generated by a phase detector (e.g., phase detector 404) and used to control a charge pump (e.g., charge pump 408) that may then drive frequency control (e.g., frequency control voltage 514 or frequency control 414). During a precharge phase, precharge devices (e.g., transistors M1, M502, and/or M504) can substantially determine the frequency control voltage. However, once start/reset is de-asserted, the phase detector control can allow up/down control signals to adjust the frequency control signal. Once PLL lock is reached, up/down control signals may not be asserted because additional adjustments to frequency control may not be required. Further, while not shown in the exemplary waveforms of FIG. 6, leakage mechanisms, as discussed above, may also be present to affect the rate of change of frequency control waveform 604.

Figure 7:
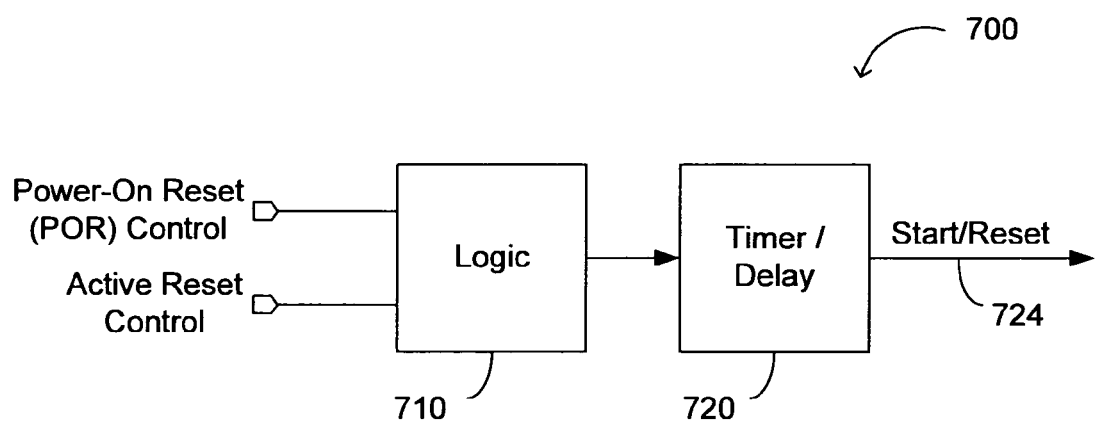
FIG. 7 is an exemplary block diagram showing a start/reset signal generation in accordance with embodiments of the present invention.

Referring now to FIG. 7, an exemplary block diagram showing a start/reset signal generation in accordance with certain embodiments of the present invention is indicated by the general reference character 700. Generally, there are at least three situations when start/reset signal 724 may be asserted: (i) power-on reset (e.g., application of Vdd to operating levels); (ii) incoming data transitions stopping (e.g., an absence of transitions in the serial data stream [e.g., input 402 in FIGS. 4A-C], generally for at least a predetermined period of time); and/or (iii) an out-of-lock state or loss of the locked state. According to certain embodiments, logic block 710 may receive a power-on reset (POR) control signal and an active reset control signal. Alternatively, logic block 710 may include a POR circuit receiving a power supply input (e.g., Vdd) for power-up detection. Further, data transitions (e.g., on serial data stream input 402) may be detected in addition to power-up prior to logic block 710 asserting the appropriate control signal for timer/delay 720. Active reset control may be asserted, for example, when an out-of-lock situation is detected or during a test mode for testing the PLL reset operation. Timer/delay block 720 may receive a control signal from logic block 710 and may output start/reset signal 724. The appropriate delay factor may depend on the particular application, but design considerations can include, for example, the slew rate of frequency control 414 as well as the response time of VCO 416.

Exemplary Method of Controlling an Oscillator

An exemplary method of controlling an oscillator can include the steps of: (i) asserting a precharge control signal for setting a frequency control to substantially minimize a frequency of the oscillator; (ii) enabling a phase detector control of the frequency control by de-asserting the precharge control signal; and (iii) locking a PLL correlating to a frequency of a received serial data stream in response to the frequency control. A leakage on the frequency control can also be used during the step of enabling, for example.

Figure 8:
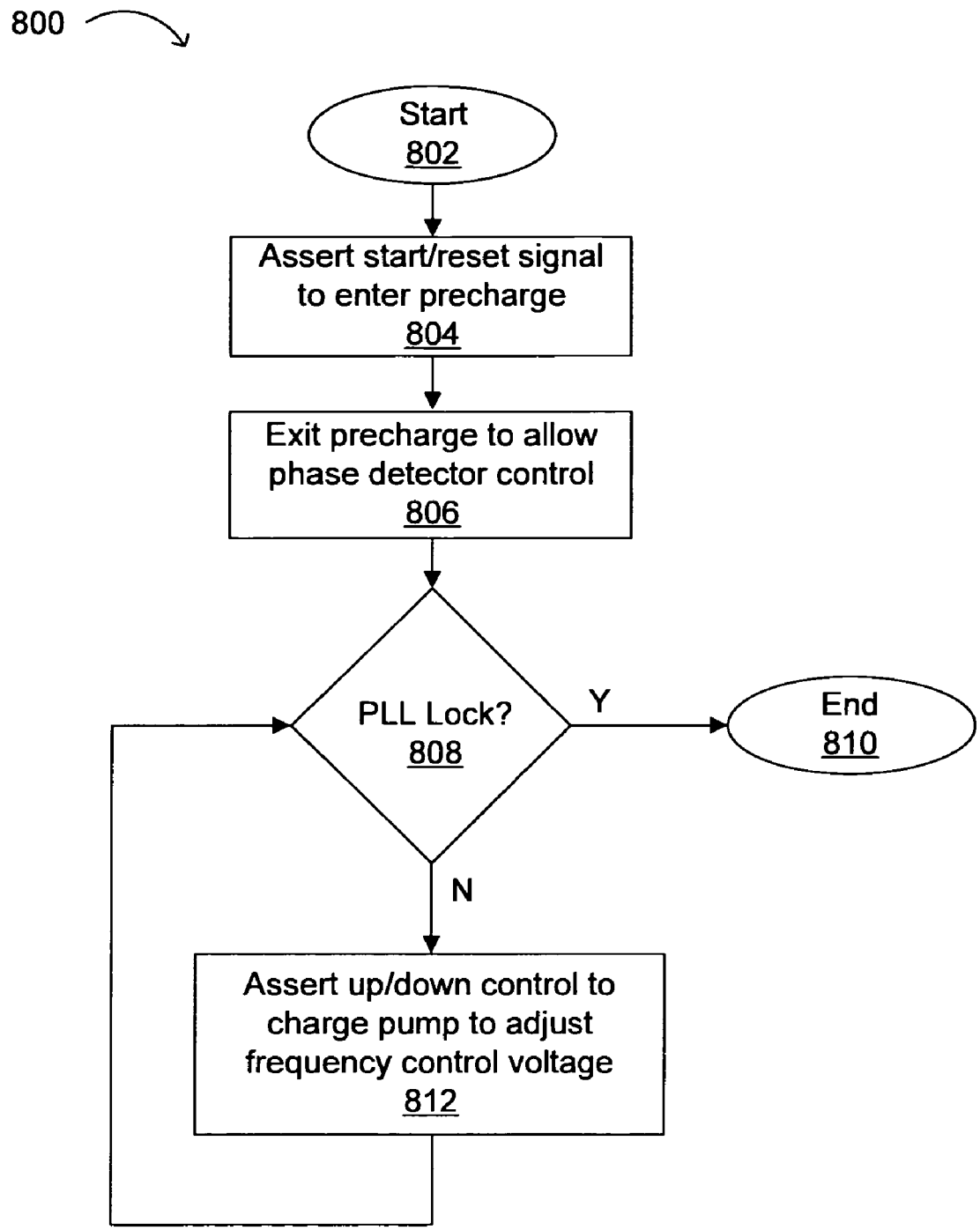
FIG. 8 is a flow diagram showing an exemplary method of controlling a voltage controlled oscillator (VCO) in accordance with embodiments of the present invention.

Referring now to FIG. 8, a flow diagram showing an exemplary method of controlling a voltage controlled oscillator (VCO) in accordance with various embodiments of the present invention is indicated by the general reference character 800. The flow can begin (802) and a start/reset signal may be asserted to enter a precharge state (804). Once a sufficient time has passed so that the associated VCO can respond, precharge may be exited to allow phase detector control of the frequency control voltage (806). If PLL lock has been attained (808), the flow can complete (810). However, if PLL lock has not been attained (808), up/down control may be asserted in order for the charge pump to adjust the frequency control voltage (812) and the flow can return to the PLL lock determination (808). Further, while not shown in the exemplary flow diagram of FIG. 8, leakage mechanisms, as discussed above, may also be present to affect the rate of change of the frequency control voltage.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A phase-locked loop (PLL), comprising:
   a) a phase detector configured to receive a serial data stream and to output a pump control signal;
   b) a charge pump configured to receive said pump control signal and to substantially determine a frequency control when a precharge control signal is in a first state;
   c) a precharge/filter circuit coupled to said charge pump and configured to substantially determine said frequency control when said precharge control signal is in a second state; and
   d) an oscillator coupled to said precharge/filter circuit and configured to provide a recovered clock in response to said frequency control, said recovered clock being correlated to a frequency of said serial data stream;
   wherein said recovered clock is at a substantially minimum frequency when said precharge control signal is in said second state.

2. A phase-locked loop (PLL), comprising:
   a) a phase detector configured to receive a serial data stream and to output a pump control signal;
   b) a charge pump configured to receive said pump control signal and to substantially determine a frequency control when a precharge control signal is in a first state;
   c) a precharge/filter circuit coupled to said charge pump and configured to substantially determine said frequency control when said precharge control signal is in a second state; and
   d) an oscillator coupled to said precharge/filter circuit and configured to provide a recovered clock in response to said frequency control, said recovered clock being correlated to a frequency of said serial data stream;
   wherein said serial data stream comprises a differential signal.

3. The PLL of claim 1, wherein said frequency control comprises one of a current value correlated to said frequency or a voltage value correlated to said frequency.

4. The PLL of claim 1, wherein said oscillator comprises a voltage controlled oscillator.

5. A phase-locked loop (PLL). comprising:
   a) a phase detector configured to receive a serial data stream and to output a pump control signal;
   b) a charge pump configured to receive said pump control signal and to substantially determine a frequency control when a precharge control signal is in a first state;
   c) a precharge/filter circuit coupled to said charge pump and configured to substantially determine said frequency control when said precharge control signal is in a second state; and
   d) an oscillator coupled to said precharge/filter circuit and configured to provide a recovered clock in response to said frequency control, said recovered clock being correlated to a frequency of said serial data stream:

wherein said precharge/filter circuit comprises a transistor coupled to said precharge control signal, said transistor being configured to provide charge to said frequency control when said precharge control signal is in said second state.

6. The PLL of claim 5, wherein said precharge/filter circuit further comprises a resistor coupled to a first capacitor and said frequency control; and a second capacitor coupled to said frequency control.

7. The PLL of claim 6, wherein at least one of said first and second capacitors comprises a variable capacitor.

8. A phase-locked loop (PLL), comprising:
a) a phase detector configured to receive a serial data stream and to output a pump control signal;
b) a charge pump configured to receive said pump control signal and to substantially determine a frequency control when a precharge control signal is in a first state;
c) a precharge/filter circuit coupled to said charge pump and configured to substantially determine said frequency control when said precharge control signal is in a second state;
d) an oscillator coupled to said precharge/filter circuit and configured to provide a recovered clock in response to said frequency control, said recovered clock being correlated to a frequency of said serial data stream; and
e) a data sampling and decision circuitry configured to receive said recovered clock and to provide retimed recovered serial data.

9. A phase-locked loop (PLL), comprising:
a) a phase detector configured to receive a serial data stream and to output a pump control signal;
b) a charge pump configured to receive said pump control signal and to substantially determine a frequency control when a precharge control signal is in a first state;
c) a precharge/filter circuit coupled to said charge pump and configured to substantially determine said frequency control when said precharge control signal is in a second state;
d) an oscillator coupled to said precharge/filter circuit and configured to provide a recovered clock in response to said frequency control, said recovered clock being correlated to a frequency of said serial data stream; and
e) controllable or selectable leakage devices configured to adjust a leakage on said frequency control.

10. A method of controlling an oscillator, comprising the steps of:
a) asserting a precharge control signal for setting a frequency control to substantially minimize a frequency of said oscillator;
b) enabling a phase detector control of said frequency control by de-asserting said precharge control signal; and
c) locking a phase-locked loop (PLL) correlating to a frequency of a received serial data stream in response to said frequency control;
wherein the step of enabling comprises using a leakage on said frequency control.

11. The method of claim 10, wherein said frequency control comprises using one of a current value correlated to said frequency or a voltage value correlated to said frequency.

12. The method of claim 10, further comprising the step of adjusting said leakage on said frequency control.

13. A precharge/filter circuit for oscillator control, comprising;
a) a first transistor coupled to a frequency control, said first transistor being controllable by a precharge control signal;
b) a resistor coupled between said frequency control and a node;
c) a second transistor coupled to said node, said second transistor being controllable by said precharge control signal;
d) a first capacitor coupled to said node and a supply; and
e) a second capacitor coupled to said frequency control and said supply, wherein at least one of said first and second capacitors includes a variable capacitor.

14. The precharge/filter circuit of claim 13, wherein said first transistor is configured to discharge said frequency control when said precharge control signal is asserted.

15. The precharge/filter circuit of claim 13, wherein said second transistor is configured to discharge said node when said precharge control signal is asserted.

16. The precharge/filter circuit of claim 13, further comprising controllable or selectable leakage devices configured to adjust a leakage on said frequency control.

* * * * *